United States Patent
Johnson

(10) Patent No.: US 6,889,238 B2
(45) Date of Patent: May 3, 2005

(54) PARALLEL DECIMATOR ADAPTIVE FILTER AND METHOD FOR ALL-RATE GIGABIT-PER-SECOND MODEMS

(75) Inventor: Russell K. Johnson, Half Moon Bay, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 722 days.

(21) Appl. No.: 09/888,957

(22) Filed: Jun. 25, 2001

(65) Prior Publication Data

US 2002/0198913 A1 Dec. 26, 2002

(51) Int. Cl.[7] .......................... G06F 17/17; G06F 17/10
(52) U.S. Cl. ...................... 708/313; 708/322; 708/319
(58) Field of Search ................................ 708/313, 316, 708/319, 322

(56) References Cited

U.S. PATENT DOCUMENTS 5,235,647 A * 8/1993 Van de Kerkhof .......... 708/313
6,356,569 B1 * 3/2002 Sonalkar et al. ............ 708/313
6,426,983 B1 * 7/2002 Rakib et al. ................ 375/346
2003/0118134 A1 * 6/2003 Harris ........................ 375/350

* cited by examiner

Primary Examiner—Tan V. Mai
(74) Attorney, Agent, or Firm—Kenneth W. Float

(57) ABSTRACT

Parallel adaptive filters and filtering methods that enable processing of an input signal in a circuit that has an clock speed many times slower than the input rate of the input signal that is processed. A polyphase decimator structure processes a data stream requiring a low pass filtered band-limited (low-rate) output that is used for high-rate output structures. The filters and methods break an input data stream into parallel paths that efficiently produce a band-limited (decimated, low-rate) filtered output. Each of the parallel paths is processed at a decimated rate to provide a filtered output signals corresponding to a filtered version of the input signal.

8 Claims, 4 Drawing Sheets

PARALLEL DECIMATOR ADAPTIVE FILTER AND METHOD FOR ALL-RATE GIGABIT-PER-SECOND MODEMS

BACKGROUND

The present invention relates generally to filters and filtering methods, and more particularly, to a parallel decimator adaptive filter and filtering method such as may be used with all-rate gigabit-per-second modems, and the like.

Adaptive filtering is necessary in high-rate modems to suppress inter-symbol interference, remove analog filter dispersion, remove adjacent channel interference, perform pulse-shaping and interpolation, and mitigate co-channel interference. Nearly all low-cost digital integrated circuits are built from CMOS technology. Use of conventional technology limits the practical processing rate to about 100 MHz, the maximum clock rate of CMOS technology. There is no known conventional high-speed digital adaptive filter implementation that can operate on input data above 100 MHz.

It would be an improvement to have a parallel decimator adaptive filter and filtering method such as may be used with all-rate gigabit-per-second modems, and the like, that improves upon conventional filtering schemes.

SUMMARY OF THE INVENTION

The present invention provides for a parallel implementation of an adaptive filter and filtering method. The parallel adaptive filter and filtering method enables processing of the signal in a technology (e.g. CMOS) which has an inherent clocking speed many times slower than the filter input rate. The present invention thus provides for low-cost digital implementations of very high-speed modems, for example, that require adaptive or fixed filtering.

The present invention is based on an extension of a previously known polyphase decimator structure that has always been applied to a totally different problem. The polyphase decimator structure optimally processes a data stream requiring a low pass filtered bandlimited (i.e., low-rate) output. In the present invention this low-rate output generated by the polyphase filtering structure is used for high-rate output structures.

The basic polyphase decimator structure breaks an input stream into parallel paths that efficiently produce a bandlimited (i.e., decimated, low-rate) filtered output. Each of the parallel paths is also processed at a decimated rate. Operating multiple polyphase decimating filter structures allows a non-decimated filtered output to be generated by lower-speed integrated circuits. If partially decimated outputs are desired, the unused polyphase structures may be combined into the structure to extend the effective filter length to provide a sub-set of the filtered outputs.

BRIEF DESCRIPTION OF THE DRAWINGS

The various features and advantages of the present invention may be more readily understood with reference to the following detailed description taken in conjunction with the accompanying drawing figures, wherein like reference numerals designate like structural elements, and in which.

DETAILED DESCRIPTION

Figure 1:
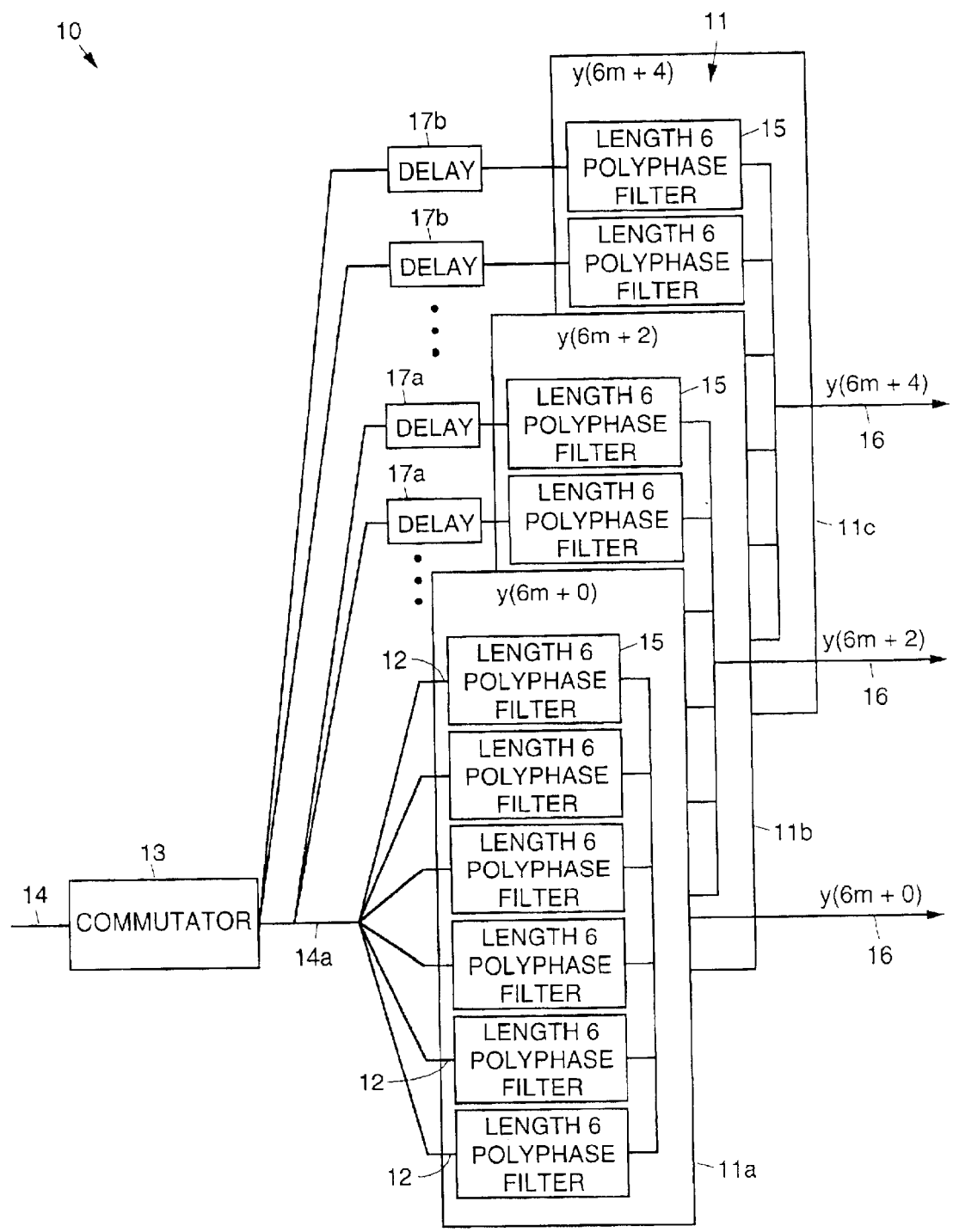
FIG. 1 illustrates an exemplary parallel decimator adaptive filter in accordance with the principles of the present invention.

Referring to the drawing figures, FIG. 1 illustrates an exemplary parallel decimator adaptive filter 10 in accordance with the principles of the present invention. The exemplary parallel decimator adaptive filter 10 is adapted to filter input signal that is input at a high clock rate on the order of many gigasamples per second, for example, using relatively low speed circuits that are clocked at a rate on the order of 100 megasamples per second, for example, to produce a filtered output signal at the high clock rate. The exemplary parallel decimator adaptive filter 10 comprises a plurality of polyphase filter integrated circuits 11a, 11b, 11c each having a plurality of inputs 12. Each polyphase filter integrated circuits 11a, 11b, 11c implements a filter such as is described below.

Figure 3:
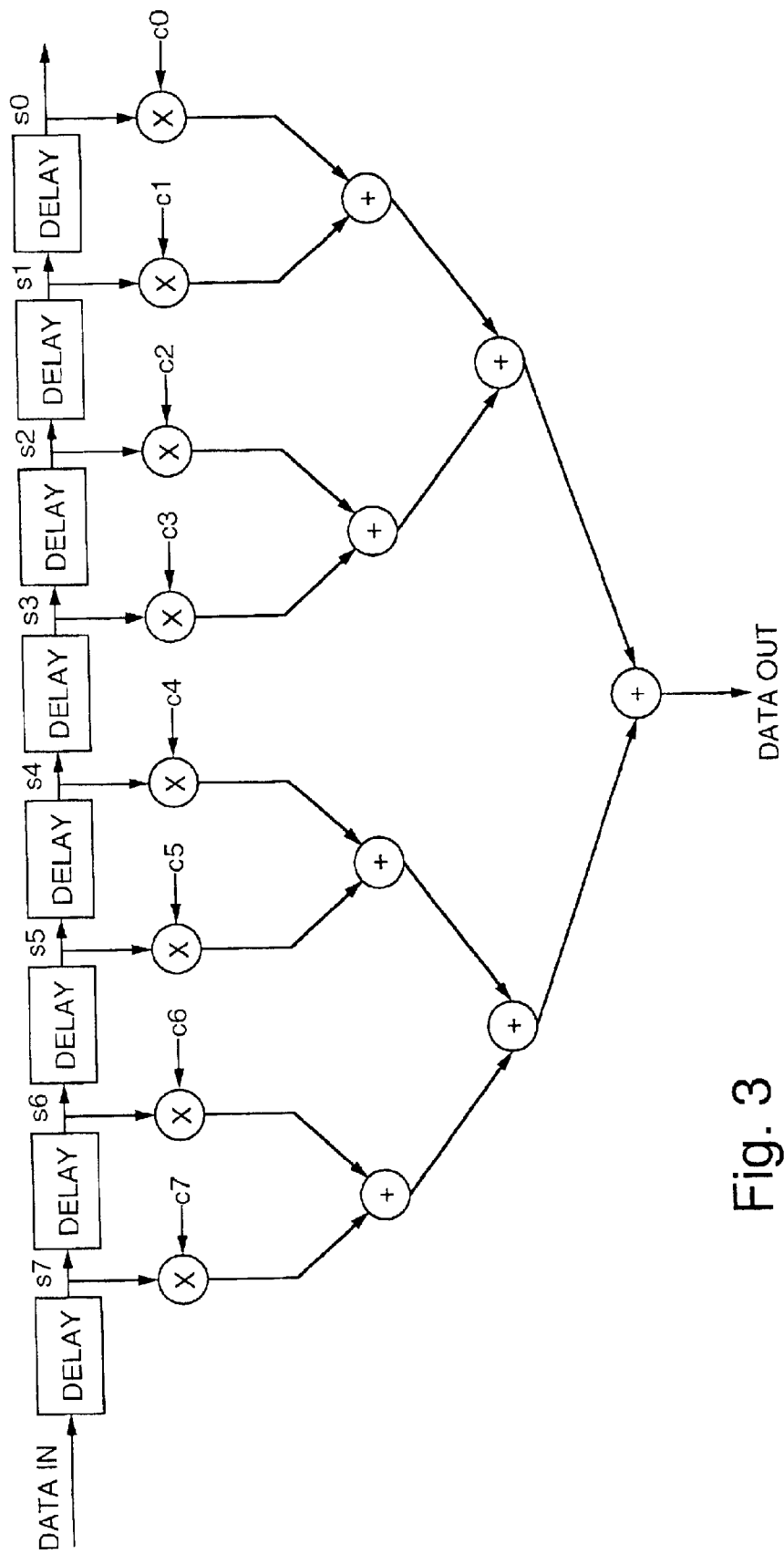
FIG. 3 illustrates an exemplary decimate-by-four polyhase filter structure.
Figure 4:
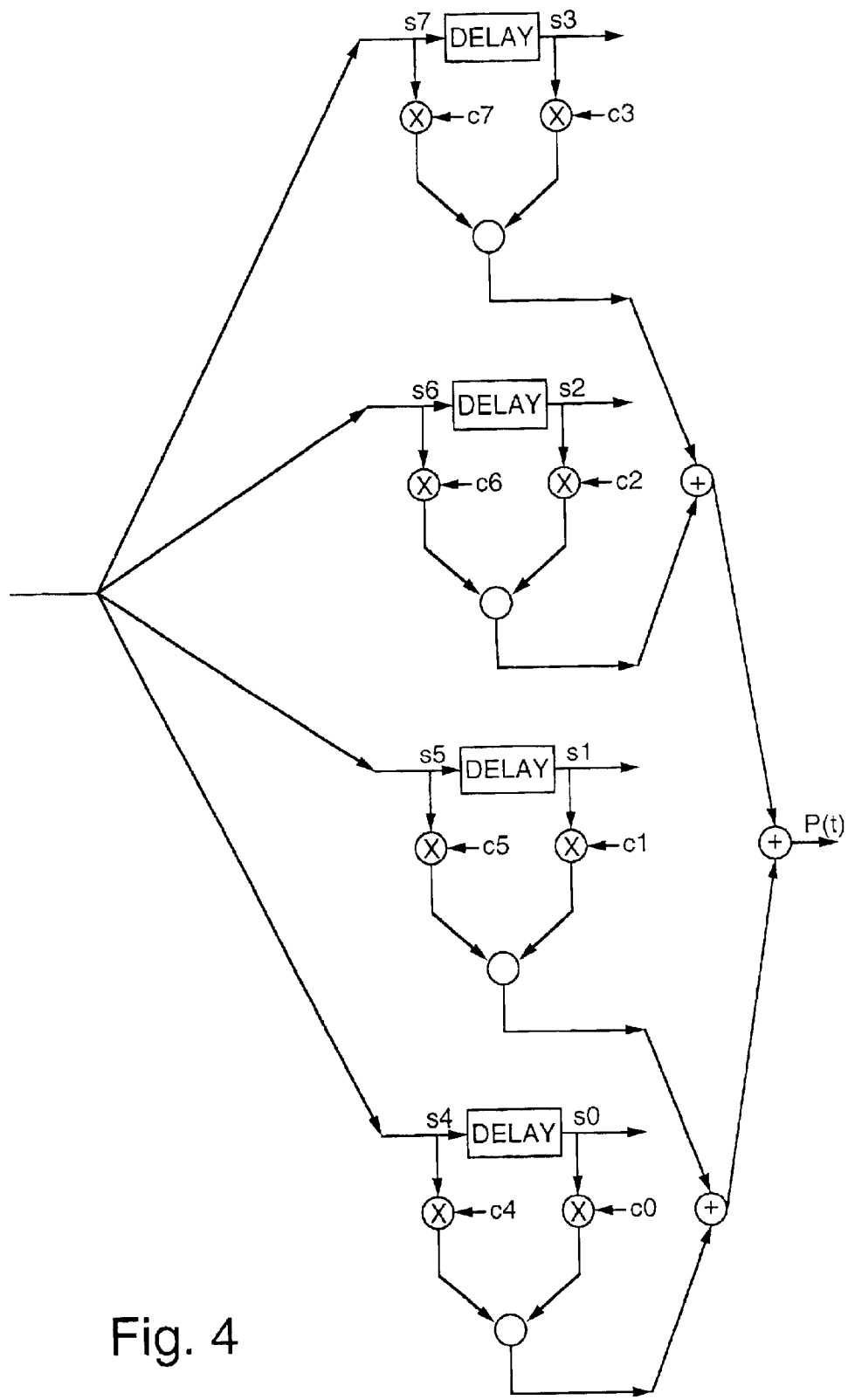
FIG. 4 illustrates an exemplary decimate-by-four polyhase filter structure.

In order to fully understand polyphase filter integrated circuits 11a, 11b, 11c, a standard finite impulse response (FIR) filter will be explained. Then, an efficient method of implementing the FIR filter, known as a polyphase filter, will then be explained. FIG. 3 illustrates an exemplary finite impulse response filter, while FIG. 4 illustrates an exemplary decimate-by-four polyphase filter structure. and A description of the finite impulse response (FIR) filter is as follows, taken with reference to FIG. 3. An 8-tap FIR filter structure is shown in FIG. 3. A FIR filter has two parts, including a delay section and a multiplier-adder section. The delay section stores a finite number of past input samples. For example, let the number of storage elements be denoted by N. This filter is called an N-tap FIR filter.

Figure 2:
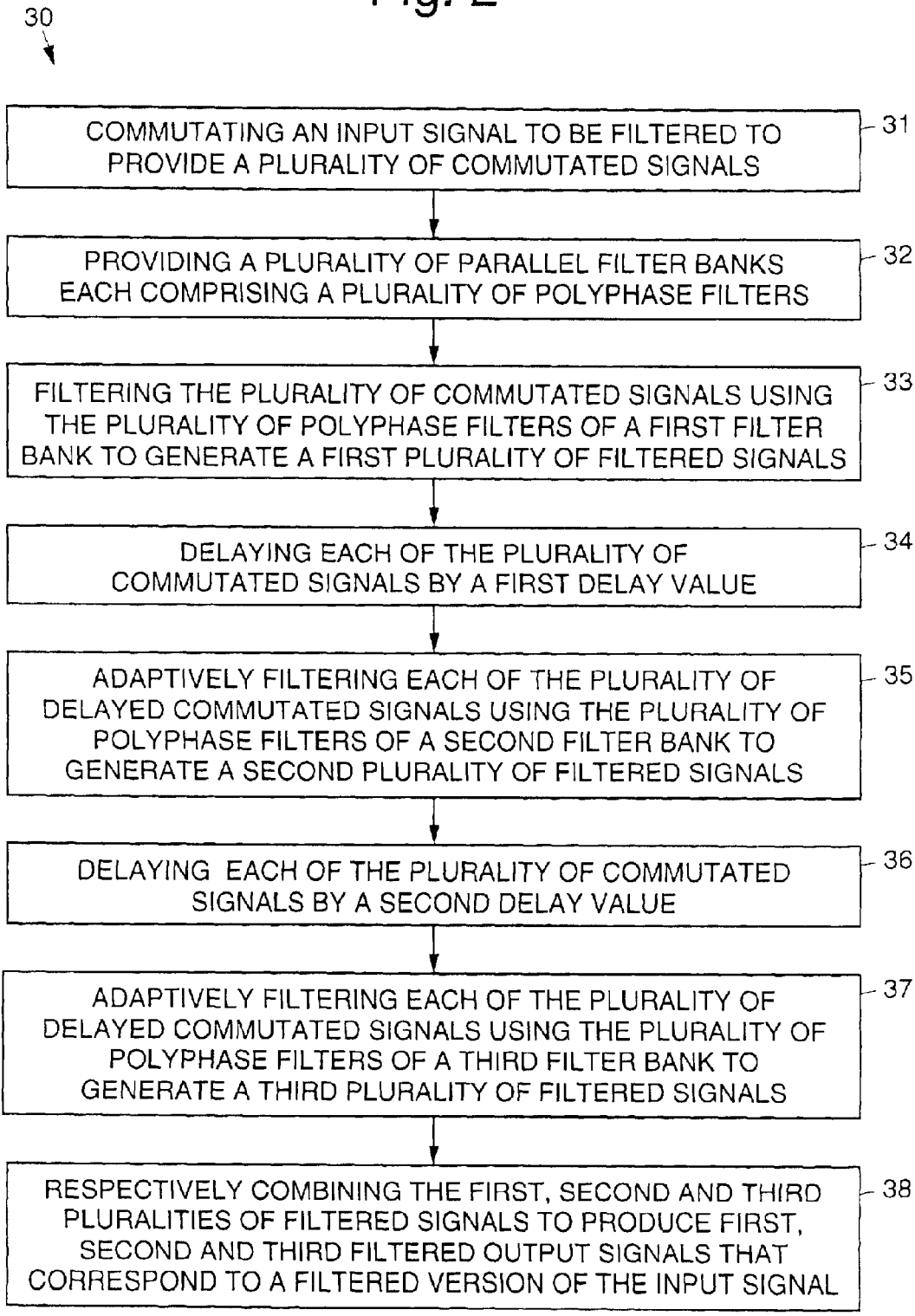
FIG. 2 illustrates an exemplary adaptive filtering method in accordance with the principles of the present invention.

The input data enters the delay line on the left side of FIG. 3. On each clock cycle all the data shifts over one delay to the right and the new input enters on the left, the data are shown as s0–s7 in FIG. 2 ("s" is an abbreviation for sample). The content of each delay element is multiplied by an associated fixed coefficient, labeled c0–c7 in FIG. 2 ("c" is an abbreviation for coefficient). All the multiplier outputs are summed to form the filtered result.

Consider the specific example shown in FIG. 3. The contents of the shift register are s7, s6, s5, s4, s3, s2, s1, s0 (i.e., samples zero through seven are stored in the shift register). Each of these samples are multiplied by its associated multiplier coefficient within the filter (c0, c1, c2, c3, c4, c5, c6, c7) to form the final filter output at time zero, F(0). The final filter output at time zero is:

$$F(0)=s0*c0+s1*c1+s2*c2+s3*c3+s4*c4+s5*c5+s6*c6+s7*c7.$$

The F(0) filtered result is output. On the next clock cycle the contents of the shift register are right shifted and the next data sample is added on the left side of FIG. 2. The contents of the register are:

s8, s7, s6, s5, s4,s3, s2, s1.

The filtered output at time 1 is F(1) and is:

$$F(1)=s1*c0+s2*c1+s3*c2+s4*c3+s5*c4+s6*c5+s7*c6+s8*c7.$$

The filtered outputs at time 2, 3, and 4 are as follows:

$$F(2)=s2*c0+s3*c1+s4*c2+s5*c3+s6*c4+s7*c5+s8*c6+s9*c7,$$

$$F(3)=s3*c0+s4*c1+s5*c2+s6*c3+s7*c4+s8*c5+s9*c6+s10*c7,$$

and $$F(4)=s4*c0+s5*c1+s6*c2+s7*c3+s8*c4+s9*c5+s10*c6+s11*c7$$

A description of the polyphase filter is as follows, taken with reference to FIG. 3. Suppose that a decimated output is required from an FIR filter, say only every fourth output of the FIR filter, for example. A straightforward implementation described with reference to the above-described FIR filter would be very inefficient because it computes F(0), F(1), F(2), F(3), F(4), and so forth. However, only F(0), F(4), F(8), . . . are desired (i.e., a decimated by 4 output). A polyphase filter provides an efficient way to compute a decimated output of a prototype FIR filter. The original filter and its coefficients are referred to as the "prototype" filter. The polyphase filter implementation rearranges the prototype filter so that it efficiently implements only the decimated outputs of the prototype filter.

Consider the polyphase structure shown in FIG. 4. This decimate by 4 polyphase structure includes four length-2 FIR filters (called polyphase filters). Note that the total number of coefficients in all of the four polyphase filters matches the total number of coefficient in the prototype filter (i.e., 2*4=8). The polyphase filter coefficients are simply decimated versions of the prototype filter. Decimating the filter coefficients of the prototype filter means taking every fourth filter coefficient. The first polyphase filter takes coefficients 0 and 4 from the prototype filter. The second polyphase filter takes coefficients 1 and 5 from the prototype filter. The third polyphase filter takes the 2 and $6^{th}$ coefficient from the prototype filter. The fourth polyphase filter takes coefficients 3 and 7 from the prototype filter.

The left side of FIG. 4 is the input commutator. The first sample from the commutator feeds the lower 2-tap polyphase filter. The next sample from the commutator feeds the third from top polyphase filter. The third sample from the commutator feeds the second from the top polyphase filter. The fourth sample feeds the top polyphase filter. After all four commutator input samples are collected, a single output sample is generated (i.e., every fourth input clock a single decimated output is formed). The single output is the sum of the output of all four length-2 polyphase filters.

Consider the output this filter structure produces. The lower polyphase filter produces the output s0*c0+s4*c4. The third from the top polyphase filter produces the output s1*c1+s5*c5. The second from the top polyphase filter produces the output s2*c2+s6*c6. The top polyphase filter produces the output s3*c3+s7*c7. The sum of all these outputs is:

$$P(0)=s0*c0+s1*c1+s2*c2+s3*c3+s4*c4+s5*c5+s6*c6+s7*c7=F(0).$$

P(0) exactly matches the output of the prototype filter at time 0, F(0). Thus, the structure is equivalent to the output of the prototype filter at time 0. Further analysis will show that the filter structure matches the output of the prototype filter at every fourth output sample. The second output of the polyphase filter is:

$$P(1)=s4*c0+s5*c1+s6*c2+s7*c3+s8*c4+s9*c5+s10*c6+s11*c7=F(4).$$

The advantage of the polyphase filter is now clear. At each new input sample to the polyphase filter only a 2-tap FIR filter must be update, versus a 8-tap FIR filter for the direct implementation of the prototype FIR filter. Also, each polyphase filter must only be updated every 4-clock cycles since this is the revisit rate of the input commutator. After all four inputs from the commutator are processed, and then the outputs of all four 2-tap polyphase filters are summed to form the decimated output.

The reason people use polyphase filters for decimator filters is that it is D times more efficient then the direct implementation of the prototype filter, where D is the decimation ratio. Only 1 polyphase filter with 2-taps must be evaluated every input clock cycle, versus the 8-taps that must be evaluated if the direct prototype filter is implemented.

Alternatively, four pairs of multipliers can be run in parallel to achieve a high-speed filter where each of the four parallel polyphase filters only runs at one-fourth of the input data rate. This allows high-rate input data to be processed by relatively low-rate filter circuits behind the commutator.

If a full-rate output is desired, the additional outputs can be generated (i.e., sample 0 plus samples 1 or 2 or 3) by adding additional polyphase filter structures in parallel with the one shown in FIG. 3, with input delays of 1, 2, and 3 respectively. Thus, if four filters are run in parallel then the output of the aggregate is a full-rate filter output. However, each of the four parallel circuits is running at one-fourth of the input data rate. Thus, it is possible to build a high-speed modem with parallel processing in lower-rate back-end polyphase filters.

Referring again to FIG. 1, each of the plurality of inputs of the polyphase filter integrated circuits 11a, 11b, 11c comprise a filter bank 11. Each of the plurality of inputs of the polyphase filter integrated circuits 11a, 11b, 11c are fed from a commutator 13 having a single input 14 and a plurality of commutated outputs 14a.

Each of the polyphase filter integrated circuits 11a, 11b, 11c or filter banks 11 comprise a plurality of short-length polyphase finite impulse response (FIR) filters 15. Outputs of the plurality of short-length polyphase FIR filters 15 of each of the polyphase filter integrated circuits 11a, 11b, 11c or filter banks 11 are combined (added) to produce a single output 16 of each respective polyphase filter integrated circuit 11a, 11b, 11c.

Signals supplied to the first polyphase filter integrated circuit 11a is not delayed. Signals supplied to the second and third polyphase filter integrated circuits 11b, 11c are coupled through and delayed by first and second pluralities of delay elements 17a, 17b respectively. For example, in the exemplary filter 10, the input data from the commutator 13 is delayed by two samples by the first delay elements 17a prior to being input to the second filter bank 11 comprising the second polyphase filter integrated circuit 11b. The input data from the commutator 13 is delayed by four samples by the second delay elements 17b prior to being input to the third filter bank 11 comprising the third polyphase filter integrated circuit 11c.

In operation, an input signal arrives at the input 14 of the commutator 13 at a predetermined input rate R. For example, an input rate of 400 Megasamples per second (Msps) may be used. The input signal is commutated into N parallel paths 14a (six paths are shown in the exemplary filter 10) by the commutator 13. The commutated input data is fed to three (N/2) sets of filter banks 11 or polyphase filter integrated circuits 11a, 11b, 11c that each comprise the plurality of short-length polyphase FIR filters 15. Each filter bank 11 operates in parallel with the other filter banks 11, generating one of N/2 filtered output signals 16 required every N input samples.

The input data from the commutator 13 is not delayed prior to being input to the first filter bank 11. The input data from the commutation 13 is delay by 2 samples prior to being input to the second filter bank 11. The input data from the commutator is delayed by 4 samples prior to being input to the third filter bank 11. Each output of the respective filter banks 11 is formed by adding the outputs of the six (N) short-length polyphase FIR filters 15. Each polyphase filter 15 operates at a rate equal to R/N.

The present invention also allows the filter length to increase as the bandwidth of the signal decreases (all-rate operation). That is, when only a sub-set of the outputs are required, the computing resources of the unused outputs are directed to assist the desired outputs. For example, if one of the N/2 filter outputs 16 is not needed in a particular application, its polyphase filters 15 may be appended to one of the other filter banks 11 to extend the effective filter length of the filter banks 11 that remain in operation.

The present invention thus provides for operation of multiple decimators (the filter banks 11) in parallel to enable non-decimated filtering beyond the limit of the technology that is used to produce the filter 10. For example, the present invention allows filtering of giga-bit-per-second signals with low-cost CMOS integrated circuits as the respective filter banks 11 that have a maximum clock rate of 100 MHz. Thus, the filter 10 has a systolic, parallel architecture structure that is amenable to ASIC implementation and allows a vast reduction in the number of integrated circuit chips required to process high-rate signals.

In addition, the use of filter coefficient double buffering allows filter coefficients to be changed "on-the-fly", enabling adaptive filter coefficient updates. Also, high-rate transmitter pulse shaping and interpolation by two may be implemented using the polyphase decimator structure of the present filter 10.

FIG. 4 illustrates an exemplary adaptive filtering method 30 in accordance with the principles of the present invention. The exemplary adaptive filtering method 30 comprises the following steps.

An input signal to be filtered is commutated 31 to provide a plurality of commutated signals. A plurality of parallel filter banks 11 are provided 32 that each comprise a plurality of polyphase filters 15. The plurality of commutated signals are filtered 33 using the plurality of polyphase filters of a first filter bank to generate a first plurality of filtered signals. Each of the plurality of commutated signals are delayed 34 by a first delay value and each of the plurality of delayed commutated signals is adaptively filtered 35 using the plurality of polyphase filters of a second filter bank to generate a second plurality of filtered signals. Each of the plurality of commutated signals is delayed 36 by a second delay value and each of the plurality of delayed commutated signals is adaptively filtered 37 using the plurality of polyphase filters of a third filter bank to generate a third plurality of filtered signals. The first, second and third pluralities of filtered signals are respectively combined 38 to produce first, second and third filtered output signals that comprise a filtered version of the input signal.

Thus, a parallel decimator adaptive filter for use with all-rate gigabit-per-second modems, and the like, has been disclosed. It is to be understood that the described embodiment is merely illustrative of some of the many specific embodiments that represent applications of the principles of the present invention. Clearly, numerous and other arrangements can be readily devised by those skilled in the art without departing from the scope of the invention.

What is claimed is:

1. An adaptive filter, comprising:

a commutator having an input for receiving a signal to be filtered and providing a plurality of commutated outputs;

a plurality of filter banks that each comprise a plurality of polyphase filters having an input and an output, and wherein the outputs of the plurality of filters are combined to produce a single output signal of the respective filter bank;

wherein the commutated outputs of the commutator are directly coupled to inputs of the filters of a first filter bank;

wherein the commutated outputs of the commutator are coupled by way of a plurality of first delay elements to inputs of the plurality of polyphase filters of a second filter bank; and wherein the commutated outputs of the commutator are coupled by way of a plurality of second delay elements to inputs of the plurality of polyphase filters of a third filter bank.

2. The adaptive filter recited in claim 1 wherein the plurality of filter banks each comprise a polyphase filter integrated circuit.

3. The adaptive filter recited in claim 1 wherein each of the plurality of polyphase filters comprise a short-length polyphase finite impulse response filter.

4. A filtering method comprising the steps of:

commutating an input signal to be filtered to provide a plurality of commutated signals;

providing a plurality of parallel filter banks each comprising a plurality of polyphase filters;

filtering the plurality of commutated signals using the plurality of polyphase filters of a first filter bank to generate a first plurality of filtered signals;

delaying each of the plurality of commutated signals by a first delay value and adaptively filtering each of the plurality of delayed commutated signals using the plurality of polyphase filters of a second filter bank to generate a second plurality of filtered signals;

delaying each of the plurality of commutated signals by a second delay value and adaptively filtering each of the plurality of delayed commutated signals using the plurality of polyphase filters of a third filter bank to generate a third plurality of filtered signals; and respectively combining the first, second and third pluralities of filtered signals to produce first, second and third filtered output signals that correspond to a filtered version of the input signal.

5. The filtering method recited in claim 4 wherein the step of filtering the plurality of commutated signals comprises adaptively filtering the plurality of commutated signals.

6. The filtering method recited in claim 4 wherein the plurality of filter banks each comprise a polyphase filter integrated circuit.

7. The filtering method recited in claim 4 wherein each of the plurality of polyphase filters comprise a short-length polyphase finite impulse response filter.

8. The filtering method recited in claim 4 further comprising the step of double buffering the input to allow filter coefficients to be changed and provide adaptive filter coefficient updates.

* * * * *